United States Patent
Yue et al.

(10) Patent No.: US 12,231,798 B2
(45) Date of Patent: *Feb. 18, 2025

(54) SUB-RANGING PROGRAMMABLE GAIN AMPLIFIER

(71) Applicant: Gigajot Technology, Inc., Glendale, CA (US)

(72) Inventors: Xin Yue, Monrovia, CA (US); Dexue Zhang, Arcadia, CA (US); Jiaju Ma, Monrovia, CA (US)

(73) Assignee: Gigajot Technologies, Inc., Glendale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/183,086

(22) Filed: Mar. 13, 2023

(65) Prior Publication Data

US 2023/0283929 A1     Sep. 7, 2023

Related U.S. Application Data

(63) Continuation of application No. 17/337,215, filed on Jun. 2, 2021, now Pat. No. 11,606,525.

(60) Provisional application No. 63/033,951, filed on Jun. 3, 2020.

(51) Int. Cl.
| | |
|---|---|
| *H04N 25/778* | (2023.01) |
| *H03F 3/04* | (2006.01) |
| *H03G 3/30* | (2006.01) |
| *H04N 25/772* | (2023.01) |

(52) U.S. Cl.
CPC ............. *H04N 25/778* (2023.01); *H03F 3/04* (2013.01); *H03G 3/30* (2013.01); *H04N 25/772* (2023.01); *H03G 2201/103* (2013.01)

(58) Field of Classification Search
CPC ...... H03M 1/1205; H03M 1/121; H03M 1/12; H04N 5/37457; H04N 5/37455; H03F 3/04; H03G 3/30; H03G 2201/103
USPC ........................................................ 348/300
See application file for complete search history.

(56) References Cited

U.S. PATENT DOCUMENTS

| | | | |
|---|---|---|---|
| 7,924,207 B2 * | 4/2011 | Snoeij | H03M 1/144 341/169 |
| 9,100,601 B2 | 8/2015 | Nishihara et al. | |
| 9,521,344 B2 | 12/2016 | Lee et al. | |
| 10,306,169 B2 | 5/2019 | Guidash et al. | |
| 10,306,171 B2 * | 5/2019 | Yoo | H04N 25/75 |
| 10,785,433 B2 * | 9/2020 | Muto | H04N 25/778 |
| 10,979,661 B2 | 4/2021 | Li | |
| 11,606,525 B1 | 3/2023 | Yue et al. | |
| 2010/0049459 A1 * | 2/2010 | De Geronimo | G01R 29/24 324/123 R |
| 2011/0292261 A1 | 12/2011 | Hwang et al. | |
| 2015/0028190 A1 | 1/2015 | Shin et al. | |
| 2015/0062395 A1 * | 3/2015 | Ono | H04N 25/778 348/301 |
| 2019/0124284 A1 * | 4/2019 | Kim | H04N 25/76 |

* cited by examiner

*Primary Examiner* — Lin Ye
*Assistant Examiner* — Chan T Nguyen
(74) *Attorney, Agent, or Firm* — Robert C. Kowert; Kowert, Hood, Munyon, Rankin & Goetzel, P.C.

(57) ABSTRACT

A sub-ranging programmable gain amplifier resolves an incoming signal into one of multiple amplitude sub-ranges and dynamically steps down the PGA output according to the identified sub-range.

20 Claims, 4 Drawing Sheets

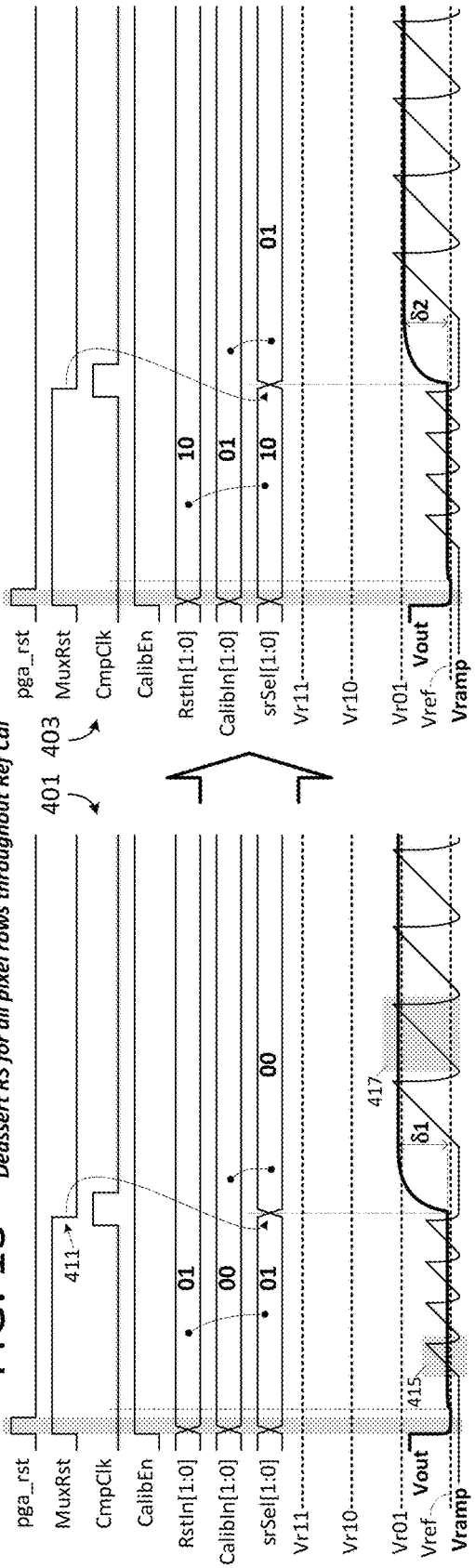
FIG. 13 Deassert RS for all pixel rows throughout Ref Cal
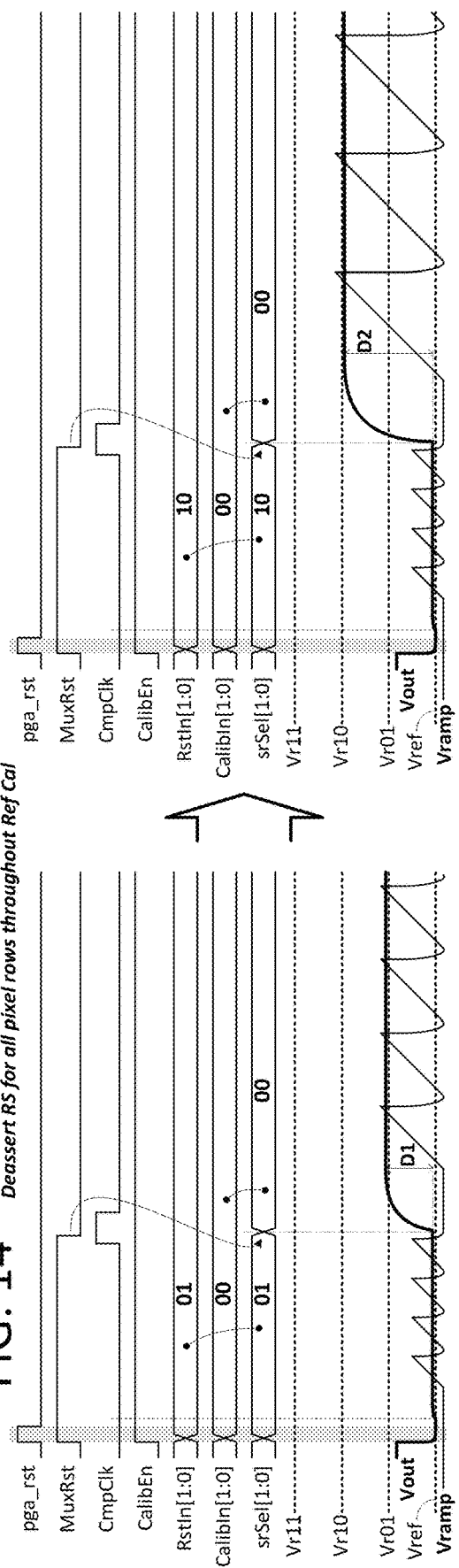
FIG. 14 Deassert RS for all pixel rows throughout Ref Cal

SUB-RANGING PROGRAMMABLE GAIN AMPLIFIER

CROSS-REFERENCE TO RELATED APPLICATIONS

This application is a continuation of U.S. patent application Ser. No. 17/337,215, filed Jun. 2, 2021, which claims priority to and incorporates by reference U.S. provisional application No. 63/033,951, filed Jun. 3, 2020, which is hereby incorporated by reference herein in its entirety.

TECHNICAL FIELD

The disclosure herein relates to signal amplifiers and analog-to-digital conversion circuitry for use in integrated-circuit image sensors and other devices/applications.

BRIEF DESCRIPTION OF DRAWINGS

The various embodiments disclosed herein are illustrated by way of example, and not by way of limitation, in the figures of the accompanying drawings and in which like reference numerals refer to similar elements and in which:

FIG. 13 illustrates exemplary control signal, voltage ramp and output voltage waveforms corresponding to the δ1 and δ2 measurement operations shown in FIG. 11; and FIG. 14 illustrates exemplary control signal, voltage ramp and output voltage waveforms corresponding to the D1 and D2 measurement operations shown in FIG. 12.

DETAILED DESCRIPTION

In various embodiments disclosed herein, a sub-ranging programmable gain amplifier (PGA) resolves an incoming signal into one of multiple amplitude sub-ranges, dynamically stepping down the PGA output according to the identified sub-range. In the context of an image sensor having thousands or tens of thousands or more pixel-array output lines coupled to respective sub-ranging PGAs, the amplitude step-down effectively aligns thousands of (or tens of thousands or more) amplified pixel signals within the same amplitude sub-range, dramatically reducing the voltage-ramp span (base to peak) required for subsequent single-slope analog-to-digital conversion (SSADC). The reduced SSADC ramp span yields correspondingly reduced analog-to-digital (A/D) conversion time and power consumption, enabling digital correlated multiple sampling (CMS)—and thus noise suppression through averaging or other combination of multiple digitized pixel signal samples—with significantly reduced sampling time/power without compromising noise-reduction efficiency.

Figure 1:
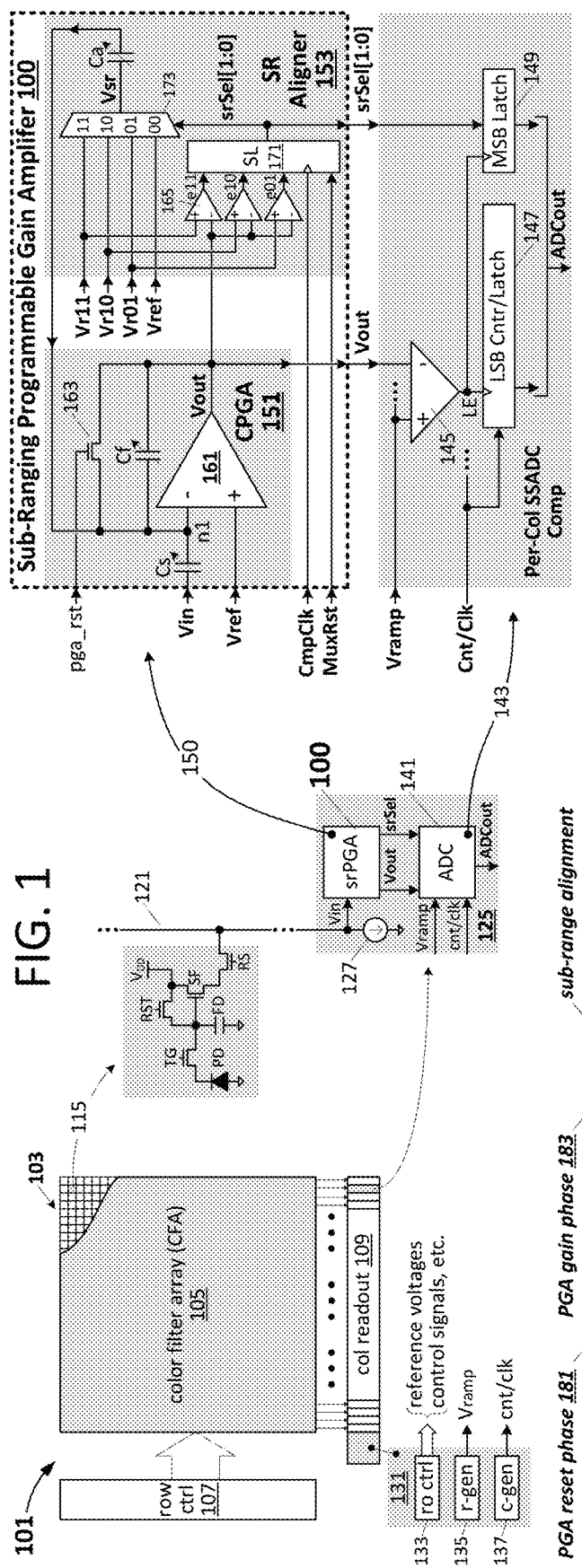
FIG. 1 illustrates an embodiment of a sub-ranging programmable-gain amplifier (srPGA) deployed within the column readout path of an integrated-circuit image sensor.

FIG. 1 illustrates an embodiment of sub-ranging PGA 100 ("srPGA") deployed within the column readout path of an integrated-circuit image sensor 101. As shown, image sensor 101 includes an array 103 of active pixels, color filter array 105 (overlaid on the illumination surface of pixel array 103—on the backside or frontside of the image sensor die), row controller 107 and column readout circuitry 109. Referring to detail view 115, constituent pixels of array 103 generally include a photodetection element PD (e.g., pinned photodiode), transfer gate TG, floating diffusion node FD, amplifier transistor (SF), read-select transistor (RS) and reset transistor (RST) interconnected to form a 4-transistor (4T) active pixel as shown. The transfer gate, read-select transistor and reset transistor for the pixels in each sensor row are sequentially activated (by like-named control signals asserted by row controller 107) to effect pixel signal readout in which (i) each pixel in a RS-selected row drives successive reset-state and image-state signals (differentially indicative of photocharge accumulated within the photodetection element during a preceding exposure interval) onto a respective column output line 121 to be sampled and digitized by per-column signal processing circuitry 125 within column readout circuit 109, and (ii) row controller 107 enables sequential row-by-row column-parallel pixel signal output to effect a "rolling-shutter" pixel-array readout. In the specific example shown, each column output line 121 is biased by a constant current source 127 so that, when the read-select transistor for a given pixel is switched on (coupling the source terminal of the in-pixel amplifier transistor SF to the column output line), any voltage change at the gate of transistor SF appears also at the source of that transistor (i.e., so as to maintain a constant gate-to-source voltage according to the current drawn by current source 127), thus effecting an in-pixel source-follower amplification scheme. In the NMOS-transistor (N-type MOSFET (metal-oxide-semiconductor field-effect transistor)) pixel embodiment shown, photoelectrons are accumulated within photodetector PD during an exposure interval and then transferred to floating diffusion node FD during readout (i.e., via TG), thus lowering the FD voltage (which is reset to $V_{DD}$ or other pixel reset voltage prior to charge transfer) in proportion to photon flux (luminance intensity) incident upon the photodetector—that is, the output voltage supplied to sub-ranging PGA 100 is negatively proportional to luminance intensity. A positively proportional pixel output may be generated in alternative embodiments (e.g., PMOS pixel implementation or in-pixel amplifier transistor SF configured in a common-source configuration in which the transistor drain drives the column output line) and image sensor 101 and components thereof may generally be changed in various ways—e.g., FD/RST/SF shared among multiple PDs/TGs to reduce effective per-pixel transistor count, multiple readout paths per PD, selective in-pixel charge binning between multiple FDs, transistor-switched capacitance at FD node to effect dynamically selectable conversion gain, etc. In all such image sensor variants (and more generally in any integrated circuit requiring low noise signal amplification), sub-ranging PGA 100 may be deployed to yield high input impedance, low-noise signal amplification with fixed or programmable gain.

In the FIG. 1 embodiment, sub-ranging PGA 100 receives the pixel readout signal (Vin) and control signals/reference voltages from readout-control logic 133 (part of global control block 131 within column-readout circuit 109) and generates, in response, an amplified, reverse-polarity analog readout signal (Vout) together with a digital sub-range selection value, srSel, outputting those values to per-column analog-to-digital converter (ADC) circuitry 141. In the single-slope ADC (SSADC) implementation of ADC 141 shown in detail view 143, analog comparator 145 compares a voltage ramp (an incrementally-stepped sawtooth waveform, "Vramp", generated by ramp generator 135 within global control block 131) with the analog srPGA output (Vout), asserting a latch-enable (LE) signal in response to a ramp step that crosses Vout (i.e., Vramp steps above Vout in this example or stepping below in a reverse polarity implementation). The latch-enable signal is supplied to latch-enable (or registration) inputs of LSB/MSB latches (or registers) 147 and 149, the LSB latch 147 to capture, as the least-significant bits (LSBs) of a per-column ADC output, a count value (e.g., generated either by counter circuitry within latch 147 in response to a count-clock from clock/count generator 137 of global control block 131, or by counter circuitry within clock/count generator 137) that increments with each Vramp step, and the MSB latch 149 to capture the digital sub-range selection value from srPGA 100 as the most-significant bits (MSBs) of the ADC output. In effect, the digital sub-range select value (a two-bit value that indicates one of four sub-ranges in the FIG. 1 example) captured within MSB latch 149 constitutes a coarse digitization of the pixel readout signal generated on line 121, resolving the full-scale amplified instance of the pixel readout signal to one of four voltage sub-ranges, while the value within LSB counter/latch 147 constitutes a fine digitization of the amplified pixel readout signal—the offset of the amplified pixel readout signal within the srSel-specified sub-range.

Referring to detail view 150 of FIG. 1, sub-ranging PGA 100 includes a capacitive programmable gain amplifier 151 and sub-range alignment circuitry 153, the former to provide high input impedance, low-noise signal amplification, and the latter to implement sub-range identification and alignment (dynamic PGA-output step-down). In the depicted example, capacitive PGA 151 includes a differential amplifier 161 having an inverting input (−) coupled via input capacitor Cs to an input signal source (Vin)—i.e., to source-follower-driven column output line 121 in the FIG. 1 image sensor example—and a non-inverting input (+) coupled to a reference voltage, Vref. Feedback capacitor Cf is coupled between the differential amplifier output (Vout) and inverting input (node n1) to effect a capacitively-coupled negative-feedback path, and a reset transistor 163 is coupled in parallel with capacitor Cf (i.e., between Vout and n1) and switched between conducting and non-conducting states in response to a PGA-reset signal ("pga_rst").

During image sensor operation, CPGA 151 cycles between precharge and gain phases in response to cycling of the PGA-reset signal. In the precharge phase, commencing when pga_rst goes high in this example, reset transistor 163 is switched on to conductively couple the output of differential amplifier 161 (which also constitutes the CPGA output, Vout) to its inverting input (node n1) and thereby form a DC-coupled negative feedback path through which amplifier 161 drives Vout so as to equalize n1 and Vref—i.e., drives Vout to ~Vref. By this operation, input capacitor Cs is precharged according to the difference between Vin and Vref, and capacitor Cf is discharged nominally to 0 v. When pga_rst goes low—effecting transition to the active (gain) phase of the CPGA cycle—transistor 163 is switched off (i.e., switched to a non-conducting state in which nominally zero current flows between transistor drain and source), isolating node n1 and thus trapping a net charge, $q_0$, on capacitors Cs and Cf, where $q0=Cs(Vin_{t0}-Vref)$ and t0 is the reset-phase Vin (and with nominally zero charged trapped on Cf). At this point (still in the active/gain phase of the PGA cycle), differential amplifier 161 responds to any change in Vin (i.e., from $Vin_{t0}$ to $Vin_{t1}$) by changing Vout (from $Vout_{t0}$ to $Vout_{t1}$) so as to redistribute charge q0 between Cs and Cf as necessary to maintain node n1 at Vref. That is:

$$Cs(Vin_{t0}-Vref)=q0=Cs(Vin_{t1}-Vref)+Cf(Vout_{t1}-Vref),$$
so that:

$$Vout_{t1}-Vref=-(Vin_{t1}-Vin_{t0})*Cs/Cf, \text{ or}$$

$$\Delta Vout=-\Delta Vin*Cs/Cf, \text{ where '*' and '/' denote multiplication and division, respectively.}$$

Thus, during active phase operation, CPGA 151 operates on a charge-conservation principle (maintaining the charge collectively trapped on capacitors Cs and Cf during the precharge phase during the transition to active phase and then throughout the active phase) to yield a linear output with a signal gain (i.e., due to charge redistribution effected by capacitively-coupled negative feedback path through Cf) negatively proportional to the ratio of the input and feedback capacitances (−Cs/Cf). Capacitors Cs and/or Ca may be programmably adjusted (e.g., varying a digital control word that switchably couples more or fewer elemental capacitances in circuit) to trim or dynamically increase/decrease the CPGA gain.

Still referring to detail view 150 of FIG. 1, sub-range aligner 153 resolves the CPGA output (an amplified version of the pixel input signal, Vin) into one of multiple (N) continuous voltage sub-ranges that collectively span the full-scale CPGA output range and then, for any signal not already within the lowest subrange, subtracts the baseline voltage for the identified subrange from the CPGA output, dynamically stepping the CPGA output down to the lowest subrange—outputting a digital representation of the identified sub-range (sub-range select value, srSel) to the downstream ADC component (141) in conjunction with the sub-range shifted CPGA output. In the FIG. 1 image sensor context, the per-column CPGA output step-down effectively aligns the amplified instances of all pixel output signals generated (on respective column-output lines 121) during a row read-out interval within the same sub-range, shrinking the requisite SSADC voltage ramp by roughly a factor of N in both amplitude and time and thus enabling dramatically faster and lower power SSADC operation.

In the FIG. 1 example, the full-scale CPGA output range (i.e., from Vref to Vfull-scale) is spanned by four non-overlapping and nominally equal sub-ranges defined by intermediate reference voltages Vr01, Vr10 and Vr11—that is, Vr01/−Vref=Vr10−Vr01=Vr11−Vr10=Vfull-scale−Vr11. The CPGA output, Vout, is compared with the intermediate reference voltages within respective comparators 165 to yield exceedance signals e01, e10, e11 (each such comparator 165 result indicating whether Vout exceeds a respective one of the intermediate reference voltages) that collectively identify which of the four sub-ranges bounds (encompasses) the CPGA output. Sub-range-select logic 171 outputs the aforementioned digital sub-range select value—an encoded two-bit value in this example (srSel[1:0]) applied to reference-multiplexer 173 to select the baseline reference voltage for the comparator-identified sub-range (and also output to downstream per-column SSADC component 141). That sub-range baseline voltage (Vsr) is fed back via alignment capacitor Ca to the inverting input of amplifier 161 (within CPGA 151) to effect a reference-voltage subtraction and thereby shift (or step or adjust) the CPGA output down by the sub-range baseline voltage—aligning the CPGA output within the lowest subrange. Though this step-down to lowest sub-range approach is presumed in embodiments discussed below, alternative reference voltage selections may be employed in all cases to shift the CPGA output to a sub-range other than the lowest sub-range (e.g., particularly where that other sub-range falls within a more linear and/or lower-noise operating range of CPGA 151. In one such embodiment, the optimal sub-range alignment is determined at image sensor startup or during production time testing (e.g., evaluating signal noise with respect to all sub-range selections for a given image and then choosing lowest noise option) followed by storage of control value (i.e., that controls mapping of reference voltages to input ports of multiplexer 173 and reset-phase reference voltage selection to effect sub-range alignment within that optimal sub-range) within a run-time or production-time programmable register.

Figure 2:
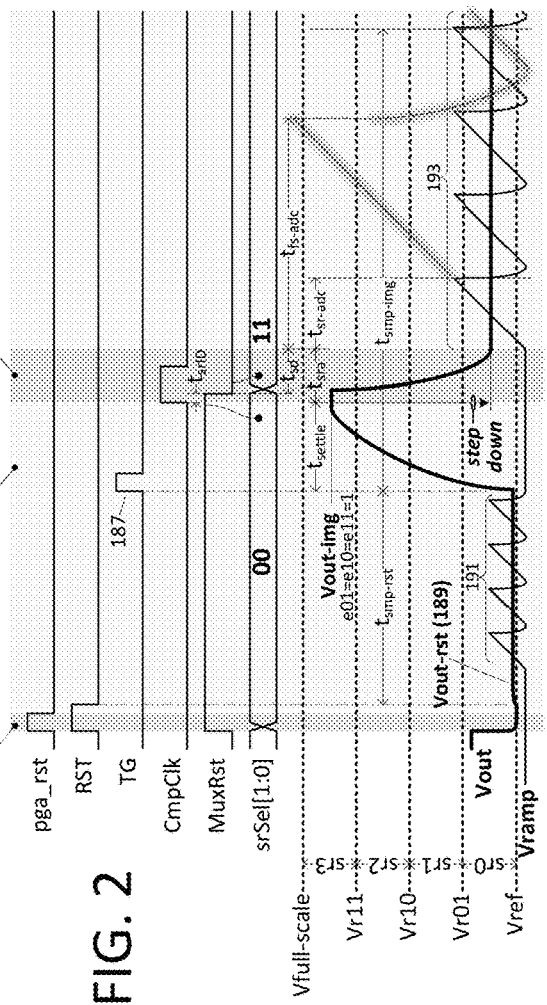
FIG. 2 illustrates combined operation of the capacitive programmable gain amplifier (CPGA) and sub-range aligner components of the FIG. 1 srPGA in an exemplary pixel readout.

FIG. 2 illustrates the combined operation of CPGA 151 and sub-range aligner 153 in an exemplary pixel readout (i.e., during an interval in which the read-select transistor of pixel 115 is switched on to enable the voltage level on column output line 121 to follow the pixel FD voltage). During the PGA reset phase 181, the PGA-reset signal and pixel reset signal (pga_rst, RST) are concurrently pulsed to precharge input capacitor Cs to a voltage corresponding to the FD pull-up level. A reset-multiplexer signal ("MuxRst," an input to FIG. 1 sub-range-select logic 171) is asserted during PGA reset to select, as the reference voltage Vsr applied to alignment capacitor Ca, a predetermined reset-phase reference voltage—in this instance Vref so that Ca is effectively discharged during PGA reset (i.e., n1-side of Ca driven to Vref via negative feedback through transistor 163, and Vsr-side of Ca rendered to Vref via multiplexer 173). In the depicted example, RST assertion continues briefly after pga_rst deassertion and then falls at the start of PGA gain phase 183 to yield a FD reset-potential that drives a corresponding reset-level pixel output (Vpix-rst)—an FD potential (and pixel output signal) to be drawn down by subsequent photocharge transfer from PD to FD. The pixel reset potential appears in amplified form (i.e., negatively amplified by −Cs/Cf) at the srPGA output (Vout, and more specifically Vout-rst as shown at 189) and is digitized one or more times (relatively low-peak and therefore fast Vramp as shown at 191 for each digitization in view of assured Vout-rst potential at or near Vref) as an initial voltage capture in a correlated double sampling (CDS) or correlated multiple sampling (CMS) readout.

At 187, the pixel transfer gate (TG) is pulsed to enable PD-to-FD photocharge transfer (concluding the reset-signal sampling interval, $t_{smp-rst}$, and commencing an image-signal sampling interval, $t_{smp-img}$), in this example driving the PGA output (i.e., negatively amplified image-signal, Vout-img) above reference voltage Vr11 and thus into the sub-range (sr3) between reference voltage Vr11 and the full-scale PGA output level (Vfull-scale). After a predetermined settling time delay ($t_{settle}$), a comparator-clock signal ("CmpClk," generated, for example, by FIG. 1 readout control circuitry 133) is pulsed/cycled to capture, within FIG. 1 sub-range-select logic 171, a sub-range select value corresponding to the voltage sub-range that bounds Vout-image—sub-range sr3 in this example and thus srSel[1:0]=11 (where '11' refers to a binary two-bit value). After a brief sub-range identification interval, $t_{srID}$, the reset-multiplexer signal (MuxRst) is lowered to transition the sub-range select value from the predetermined reset-signal sub-range ('00') to the dynamically determined Vout-img sub-range ('11' in this sr3 example), and thereby step the voltage applied to the aligner-side of capacitor Ca (Vsr) from Vref to Vref11. As CPGA 151 remains in gain phase at this point, amplifier 151 responds to the Vsr step (from Vref to Vr11) by stepping down Vout to redistribute charge q0 between Cs, Cf and Ca as necessary to maintain node n1 at Vref. That is:

$$Cs(Vin_{t0}-Vref)=q0=Cs(Vin_{t1}-Vref)+Cf(Vout_{t1}-Vref)+Ca(Vsr-Vref)$$

Sizing (or programmatically trimming) capacitors Cf and Ca to have nominally equal capacitance yields the following srPGA analog outputs prior to and after the step-down (sub-range alignment) triggered by srSel transition:
 (i) prior to sub-range alignment (when srSel=00 and Vsr=Vref):
  $Vout_{t1}-Vref=-(Vin_{t1}-Vin_{t0})*Cs/Cf$, or
  $\Delta Vout=-\Delta Vin*Cs/Cf$
 (ii) after sub-range alignment (when srSel=11 and Vsr=Vr11):
  $Vout_{t1}-Vref=-[(Vin_{t1}-Vin_{t0})*Cs/Cf]-(Vsr-Vref)$, or
  $\Delta Vout=-\Delta Vin*Cs/Cf-(Vsr-Vref)$;

Thus, the sub-range alignment action (triggered by the srSel transition) steps down Vout by the difference between the baseline voltage for the pre-step-down Vout sub-range (Vr11 in this example) and the baseline voltage for the lowest Vout subrange (Vref), ensuring that the post step-down output voltage falls within the lowest sub-range regardless of pre step-down output voltage level—aligning the analog outputs of all per-column srPGAs within sub-range sr0 and encoding the per-column sub-range shift/step-down in the sub-range selection value.

Continuing with FIG. 2, after a step-down settling time interval, $t_{sd}$ (the sub-range identification interval $t_{srID}$ and step-down settling time $t_{sd}$ collectively constituting a sub-range alignment interval $t_{sra}$), one or more sub-range ADC operations are executed in respective/successive sub-range ADC intervals ($t_{sr-adc}$)—four such operations reflected in respective Vramp cycles 193 in this correlated multi-sampling example—to latch respective sub-range ADC results. As the voltage ramp for each sub-range ADC need only traverse one out of N total sub-ranges (where N=4 in this example), the net time required per image-state sample is reduced roughly by a factor of N (e.g., $t_{sr-adc}$ per sub-range SSADC ramp vs. $t_{fs-adc}$ for full-scale SSADC ramp shown in shaded outline)—a time (and power) savings multiplied in a correlated multiple sampling image sensor by the number of image-state signal conversions per pixel readout. Moreover, the shortened interval between pixel reset and image signal sampling/conversion (i.e., compared to the longer interval between those operations in a conventional full-scale ramp per image signal sample) yields improved correlation/reduced noise and thus enhanced dynamic range in both CDS and CMS readouts.

Figure 3:
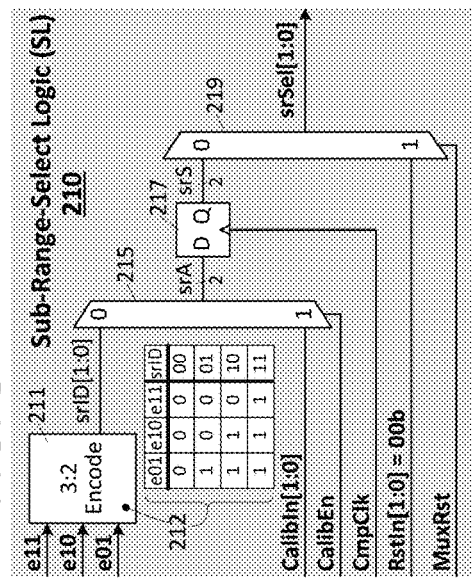
FIG. 3 illustrates a sub-range-select logic circuit embodiment that may be deployed within the FIG. 1 sub-range aligner.

FIG. 3 illustrates a sub-range-select logic circuit embodiment (210) that may be deployed within the FIG. 1 sub-range aligner to implement logic circuit 171. As shown, comparator results (e01, e10, e11 from comparators 165 in FIG. 1) are supplied to a 3:2 encoder 211 which performs the combinatorial function shown at 212 to yield a two-bit sub-range identifier (ID) value, srID[1:0]. Except during calibration operations, discussed below, control signal CalibEn is deasserted so that calibration multiplexer 215 passes the sub-range ID value to flop stage 217 (i.e., as an asynchronous sub-range value, srA) to be captured therein in response to transition (rising edge in this example) of compare clock signal, CmpClk (shown in the FIG. 2 timing diagram as a low-duty clock, though a 50% duty or higher clock signal may also be generated). Flop stage 217 outputs the compare-clock-synchronized sub-range value, srS, to reset multiplexer 219 which alternately outputs, as the sub-range select value (srSel[1:0]), a reset-phase sub-range value (shown as '00b' in the FIG. 3 example, but used to select other subrange reference voltages during calibration as discussed below) and the encoded-compare value, srS, as control signal MuxRst cycles between asserted and deasserted states. Thus, in the PGA-reset phase shown in FIG. 2, assertion of MuxRst assertion commencing with the PGA reset phase and continuing until the conclusion of the sub-range identification interval (tsrID—the interval that transpires following compare-clock assertion) ensures that the voltage across alignment capacitor Ca remains unchanged (i.e., srSel[1:0] remains at 00b to set Vsr at Vref) until after the amplified image-state pixel signal (Vout-img) and the srS output of flop stage 217 have settled. When MuxRst goes low (shortly after the CmpClk rising edge in the FIG. 2 example), the comparator-identified sub-range (srS) is output via reset multiplexer 219 to reference select multiplexer (multiplexer 173 in the FIG. 1 embodiment)—in the FIG. 2 example, selecting Vr11 as the Vsr output and thus stepping Vout-img down by the potential difference between Vr11 and Vref. For image signals that settle (prior to step down) within subranges sr0, sr1 or sr2, MuxRst deassertion will select reference voltages Vref, Vr01 and Vr11, respectively, to drive the Vsr input to alignment capacitor Ca, thereby stepping Vout-img down by voltages 0V (Vref–Vref), Vref01–Vref and Vref10–Vref, respectively.

The FIG. 3 sub-range select logic implementation may vary in numerous ways. For example, the three comparator inputs may be stored without encoding (omitting encoder 211, which may alternatively implement a gray code or the like) and output as separate multiplexer control signals (with reference multiplexer 173 outputting Vr11, Vr10, Vr01 or Vref in response to e11/e10/e01=1vv, 01v, 001 or 000, respectively, where 'v' designates any valid logic level). Also, where not needed for timing synchronization or pipelining support, flop-stage 217 may be omitted. Additionally, more or fewer comparator input signals may be supplied (e.g., in an srPGA that resolves input signals to more or fewer than four sub-ranges) and applied to generate a sub-range select value (encoded or not) that selects between more or fewer sub-range reference voltages. Moreover, while non-overlapping voltage sub-ranges having a nominally uniform spans have been described thus far (and are referenced in embodiments below), in all such cases voltage sub-ranges may have intentionally non-uniform voltage spans (e.g., non-linear progression between baseline reference voltages for respective sub-ranges, with optional partial sub-range overlap), with offset-lookup used to capture an ADC adjustment corresponding to a given sub-range step down. Additionally, the parallel encoders 165 shown in FIG. 1 (of which there may be more or fewer than three) may be deemed part of subrange-select logic circuit 171 (and 210) and in any event may be enabled by a control signal (e.g., compare-enable signal) to limit power consumption therein to brief compare intervals (e.g., when compare-enable is pulsed). In yet other embodiments, one of which is discussed in reference to FIG. 4 below, one or more comparators may generate successive compare results for respective reference voltages—that is, a sequential compare operation in which different sub-range reference voltages are supplied to a shared comparator during successive intervals, reducing the hardware footprint and (as discussed below) the number of comparator deadzones bearing on sub-range voltage ramp overshoot.

Figure 4:
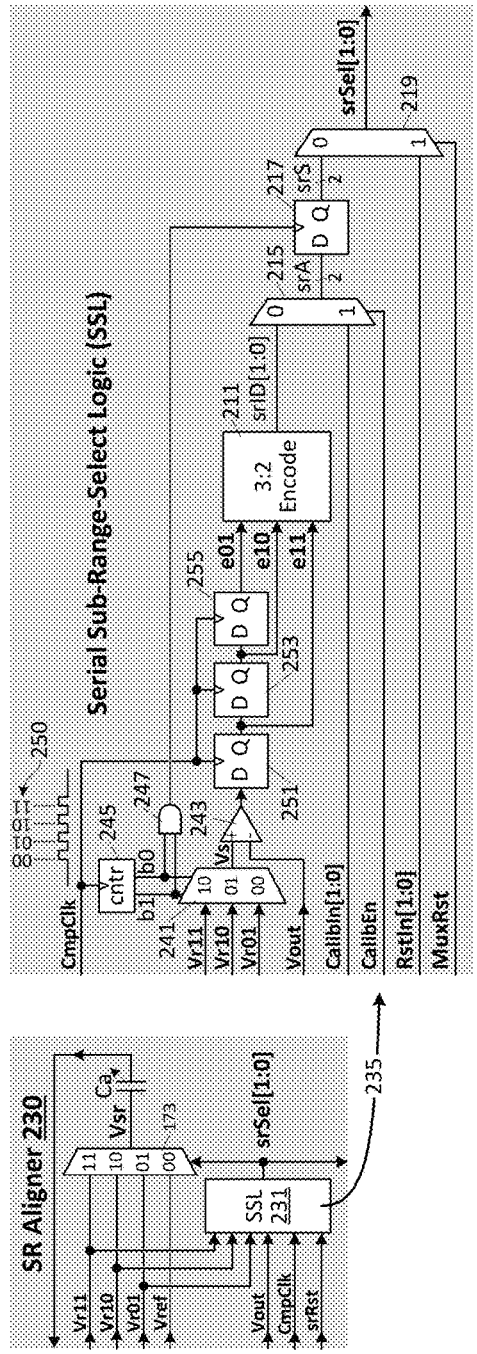
FIG. 4 illustrates an alternative sub-range aligner embodiment in which a single comparator is applied to successively compare the CPGA output to respective reference voltages.

FIG. 4 illustrates an alternative sub-range aligner embodiment 230 in which a single comparator is applied to successively compare the CPGA output (Vout and more specifically Vout-img) to respective reference voltages. As shown, subrange aligner is implemented generally as discussed in reference to FIGS. 1-3 (and may be deployed in place of sub-range aligner 153 of FIG. 1), but with parallel comparators 165 and sub-range-select logic 171 replaced by a serial sub-range-select logic circuit 231. Per exemplary implementation shown in detail view 235, instead of generating reference-comparison results e01/e10/e11 in parallel within respective comparators, multiplexer 241 routes sub-range reference voltages Vr01, Vr10 and Vr11 in succession (as selected reference, Vs) to a shared comparator 243. In the depicted embodiment, the comparator clock (CmpClk) is cycled four times per sub-range selection to select the three reference voltages at respective clock edges, sequencing a two-bit counter 245 (generating bits b1:b0) through values 00, 01 and 10 (to make corresponding reference voltage selections via multiplexer 241) and, in response to the last of the four comparator clock edges (b1:b0=11), drive the output of logic AND gate 247 high to trigger storage of an asynchronous selection value (srA) within register 217. The first three comparator clock edges (marked at 250 by corresponding counter (245) outputs 00, 01, 10) shift the successive comparator results into flop stages 251, 253, 255, the outputs of which are coupled in parallel to encoder 211 to enable generation of a two-bit sub-range identifier srID [1:0], with that value propagating through calibration multiplexer 215, latched in flop-stage 217 and eventually selected via reset multiplexer 219—circuit components that operate generally as discussed above (and subject to numerous variations as discussed above). Where the full-scale srPGA output is spanned by more or fewer than four sub-ranges (a subdivision and corresponding sub-range quantity that may be programmable in some embodiments), serial sub-range-select logic 231 may be implemented with correspondingly higher/lower CmpClk counter bit-depth, reference voltage inputs to multiplexer 241, flop stages 251/253/255 and encoded bit-depth (output of encoder 21). Also, as with the parallel comparator embodiment of FIG. 3, shared comparator 243 may be selectively enabled (e.g., by one or more compare-enable pulses generated at times corresponding to reference-compare intervals) to reduce power consumption during idle intervals.

Figure 6:
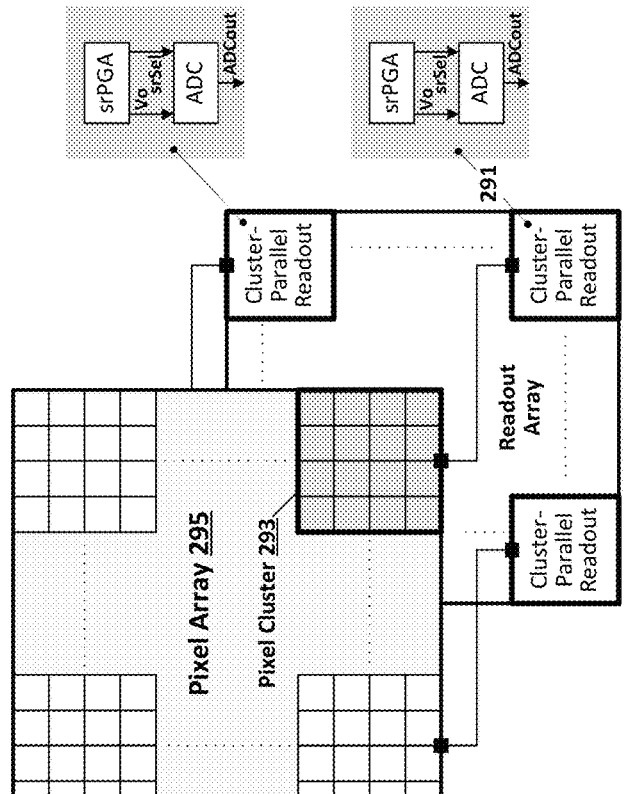
FIGS. 5 and 6 illustrates exemplary and non-limiting architectural deployments of sub-ranging PGAs and corresponding SSADC circuitry with respect to a pixel array.
Figure 5:
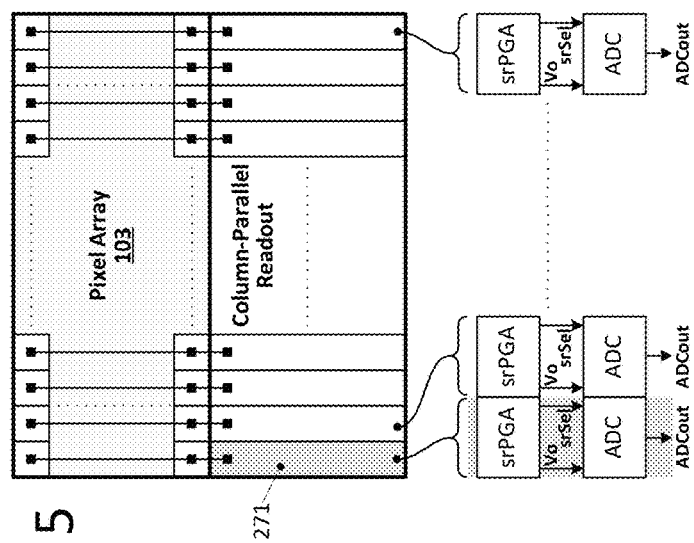

FIGS. 5 and 6 illustrates exemplary and non-limiting architectural deployments of sub-ranging PGAs and corresponding SSADC circuitry with respect to a pixel array. In the column-parallel readout architecture of FIG. 5, a respective srPGA/ADC readout circuit 271 (e.g., implemented as discussed in reference to FIGS. 1-4) is provided per column of pixels within pixel array 103, enabling the outputs of a selective row of pixels to be amplified, sub-ranged and digitized in parallel. In the cluster-parallel readout architecture of FIG. 6, a respective srPGA/ADC readout circuit 291 is provided per R×C pixel cluster 293 (i.e., each cluster constituting a subset of pixels within pixel array 295, with R being the number of pixel rows per cluster and C being the number of pixel columns per cluster and R=C=4 in the depicted example), enabling cluster-parallel readout in which respective pixels from all clusters (e.g., one pixel per cluster) are read out concurrently (with full array read out achieved by cycling cluster row/column selection through the N×M per-cluster pixel count). In both implementations, charge binning (transferring photocharge from two or more PDs to a shared FD node and/or switchably coupled set of FD nodes) and/or voltage binning (two or more pixels concurrently driving same column output line or cluster output line) may be applied to trade off image resolution for increased dynamic range (e.g., with some srPGA/ADC circuits 271/291 being unused where selected column output lines and/or cluster output lines are unneeded in a given binning configuration).

Figure 7:
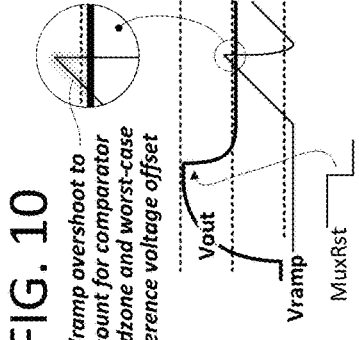
FIG. 7 illustrates considerations bearing on calibration of various srPGA embodiments disclosed herein.

FIG. 7 illustrates considerations bearing on calibration of the sub-ranging PGA embodiments above—namely that (i) intermediate reference voltages (Vr01, Vr10, Vr11) used to identify the sub-range bounding a given amplified image signal (Vout-img) and to step-down the amplified image signal may be offset from ideal, and (ii) the capacitance ratio between alignment and feedback capacitors within individual per-column srPGAs may vary from the nominal unity value required for precise sub-range shift. As an example, if an amplified image signal may have any voltage level with a full scale voltage range (from Vref to Vfull-scale) is to be quantified by a n-bit ADC output value, and that the full-scale range is sub-divided into four nominally equal sub-ranges (e.g., sr0, sr1, sr2, sr3 as shown in FIG. 2), then A/D conversion of an image signal that falls precisely at a reference voltage level should yield an ADC output having one of four MSB values (i.e., ADCout[n-1:n-2]='00' for a signal aligned with Vref, '01' for a signal aligned with Vr01, 10 for a signal aligned with Vr10, and '11' for a signal aligned with Vr11) and a zero-valued LSB component (i.e., ADCout[n-3:0]='0 . . . 00'). Accordingly, A/D conversion of an image signal aligned precisely with a reference voltage that deviates from the ideal reference level (i.e., at the point of reference-voltage application within a per-column srPGA) will result in a nonzero LSB component of the ADC output—an under flow or overflow representative of an offset error from the precise reference voltage level implicit in the srPGA sub-range selection value (and reference-voltage step-down) which otherwise constitutes the MSB component of the ADC. In a number of embodiments, column output logic (and more specifically reference control generator 133 within readout control block 131 as shown in FIG. 1) provides for programmable, calibration-time adjustment of reference voltages Vr01, Vr10, Vr11 to minimize aggregated offset error (e.g., average error, median error, etc.) within per-column srPGA/ADC circuitry. Even in those cases however, reference voltage errors may remain at the point of application (i.e., within individual srPGAs), and column-to-column variance between the ratio of capacitors Ca and Cf will yield non-uniform reference voltage step down (as the per-column step-down is scaled by the Ca/Cf multiplier) and thus column-to-column-varying offset error in the srPGA/SSADC signal digitization.

FIG. 7 illustrates exemplary calibration-time measurements used to correct for both per-column offset between actual and ideal reference voltage levels and per-column offset resulting from amplified signal step-down error (e.g., non-unity gain effected by per-column variance between capacitors Ca and Cf). More specifically, the srPGA is manipulated via the calibration and reset multiplexers shown in FIGS. 3 and 4 (i.e., multiplexers 215 and 217) to produce, successively for each intermediate reference voltage, a per-column srPGA output representative of the voltage step produced by that intermediate reference voltage (i.e., step produced by application of that intermediate reference voltage to capacitor Ca). The voltage-step output is digitized by the SSADC to yield a digital calibration value indicative of the per-column offset between actual and ideal step size, thereby enabling correction of both reference voltage error and Ca/Cf scaling error. In a "differential-step" calibration approach, the voltage steps corresponding to individual reference voltages are measured (i.e., generated and digitized) relative to one another, yielding measurement values δ1, δ2, δ3 as shown in FIG. 7. Under this approach, the SSADC voltage ramp need only traverse a differential subrange (i.e., difference between any two level-adjacent reference voltages) to produce a differential measurement (δ1, δ2, δ3), enabling implementation of a small-footprint SSADC ramp generator (e.g., element 135 of FIG. 1) that ramps only from a baseline somewhat below Vref to approximately Vfull-scale/N (where N is the number of voltage sub-ranges) as both run-time and calibration-time voltage ramps may nominally be constrained to that range. In another, "full-step" calibration approach (which may be executed as a supplement to the differential-step approach), the voltage measurements corresponding to individual reference voltages are referenced to Vref, so that a progressively higher SSADC ramp is required for each higher reference voltage and yield full-step measurements D1, D2, D3 as shown in FIG. 7.

Figure 8:
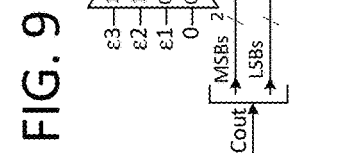
FIG. 8 illustrates exemplary/conceptual application of reference-voltage full-step measurements to correct reference-voltage offset/step error in a raw srPGA/analog-to-conversion output.
Figure 9:
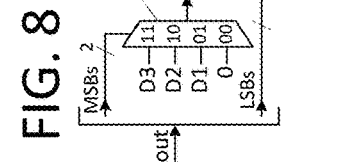
FIG. 9 illustrates an alternative offset/scaling-compensation approach in which signed error values corresponding to respective differences between ideal and measured full-step values are recorded during calibration and then individually selected and summed with a raw analog-to-digital (A/D) conversion result to yield an offset-compensated digital pixel value.

FIG. 8 illustrates exemplary/conceptual application of the reference-voltage full-step measurements (i.e., D1, D2, D3—values that may be reconstructed in the differential step approach by summing individual differential-step measurements: D2=δ1+δ2; D3=δ1+δ2+δ3) to correct reference-voltage offset/step error in a raw srPGA/SSADC output. In the four-sub-range example shown, the two most-significant bits of the ADC result (i.e., the sub-range selection/ID value) are applied to select (310) a full-step sub-range measurement which is then added (312) to the LSB component of the ADC value to produce an offset-compensated digital pixel value ($D_{Pix}$). FIG. 9 illustrates an alternative offset/scaling-compensation approach in which signed error values (ε1, ε2, ε3 as shown in FIG. 7) corresponding to respective differences between ideal and measured full-step values are recorded during calibration (e.g., ε1=0100 . . . 00b-D1; ε2=1000 . . . 00b-D2; ε3=1100 . . . 00b-D3) and then individually selected by the MSBs of the raw ADC result (via selection circuitry 320) and summed with the raw ADC result (signed summation logic circuit 322) to yield an offset-compensated digital pixel value. This latter approach (FIG. 9) may reduce calibration value storage overhead (i.e., storing ε1-ε3 instead of D1, D2, D3—an option in all embodiments discussed herein) as the signed error values are likely to have lower bit depth (e.g., 3 to 5 bits plus sign bit) as compared to full-step measurement values (generally having a bit depth at or near the ADC bit-depth). The relatively low error-value bit depth may also enable smaller-footprint selection circuitry and summation circuitry (i.e., selection circuit 320 smaller than 310 due to reduce input value bit-depth and summation circuit 322 similarly smaller than summation circuit 312), which may be particularly beneficial where offset-compensation circuitry is implemented within the image sensor die (or image-sensor IC package), rather than by off-chip processing circuitry.

Figure 10:
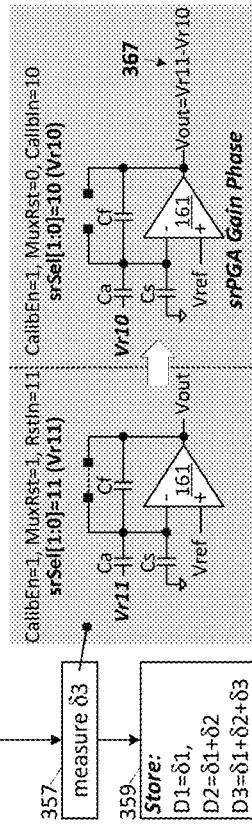
FIG. 10 illustrates an exemplary sub-range ramp overshoot implemented to ensure valid conversion across the ideal sub-range span plus a predetermined or programmed tolerance factor.

Returning briefly to FIG. 7, as reference voltage offset and/or step-scaling error (non-unity Ca/Cf ratio) may vary from one reference voltage to the next (and from one per-column srPGA to the next), the effective sub-range voltage spans may not be uniform. For example, if D2 exceeds ideal level ($Vr10_{ideal}$) for a given srPGA, it follows that any Vout-img (generated by that srPGA) falling between actual Vr01 and Vr11 levels will, at least after step-down, yield a signal level that may exceed the ideal sub-range span (i.e., may be greater than the span between Vr01ideal and Vref). As applied reference voltage levels may vary from one per-column srPGA to the next, and reference voltage step-down amplitude may also vary (from per-column srPGA to the next), it becomes possible/likely that, within collective srPGA array, reference-voltage step down for all identified sub-ranges will yield signal levels that may exceed the ideal sub-range span. Adding to this consideration that the reference-voltage comparators deployed for sub-range identification (e.g., elements 165 of FIG. 1 or 243 of FIG. 4) will generally have deadzones (e.g., on the order of a few millivolts), it becomes possible that a stepped-down voltage will exceed or fall below the ideal sub-range span (e.g., between Vref and $Vr01_{ideal}$). Accordingly, in a number of embodiments, a predetermined sub-range ramp overshoot as shown in FIG. 10 (and starting point below Vref) is implemented to ensure valid conversion across the ideal sub-range span (Vref to $Vr01_{ideal}$) plus a predetermined or programmed tolerance factor (e.g., in the latter case with programmed Vramp starting and/or ending voltage levels determined dynamically at run time or during device test/production).

Figure 11:
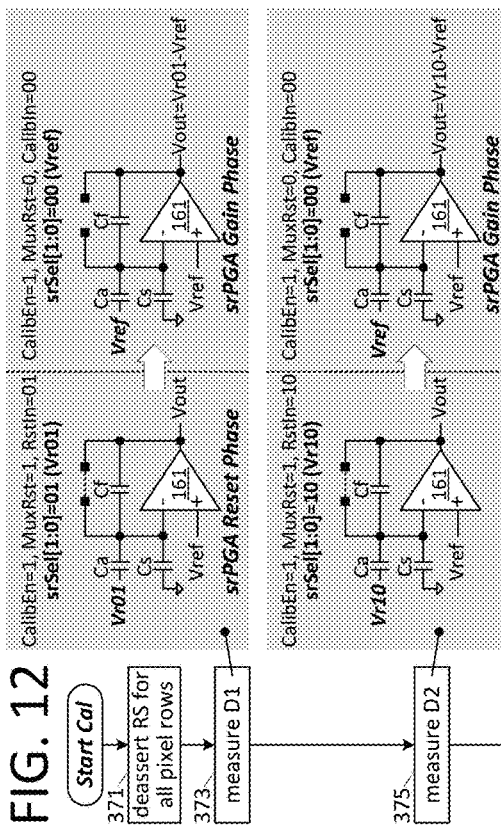
FIG. 11 illustrates an exemplary differential-step calibration sequence.

FIG. 11 illustrates an exemplary differential-step calibration sequence—grounding the srPGA input (Vin) at 351 by deasserting the read-select signal for all pixel rows, measuring δ1, δ2 and δ3 at 353, 355 and 357, respectively, and then storing full-step values D1, D2 and D3 at 359 (with D2=δ1+δ2 and D3=δ1+δ2+δ3 as shown). In each measurement step, alignment capacitor Ca is precharged to the reference voltage under measurement during the srPGA reset phase (i.e., in the context of FIG. 1/FIG. 3 sub-range-select logic, driving MuxRst high while pga_rset is asserted and RstIn is set to select the relevant reference voltage—Vr01 for δ1, Vr10 for δ2, and Vr11 for δ3) and then driven by the baseline reference voltage for the relevant sub-range during the succeeding srPGA gain phase (i.e., Vref for δ1, Vr01 for δ2, and Vr10 for δ3). In the depicted embodiment, the baseline reference voltage selection is effected by preconfiguring the calibration multiplexer (element 215 in embodiments of FIGS. 3 and 4) to output a CalibIn value corresponding to the baseline reference voltage so that, upon deassertion of MuxRst (selecting CalibIn instead of RstIn), the voltage applied to alignment capacitor Ca transitions from the reference voltage under measurement to the next lower reference voltage, thus effecting an srPGA output equal to the difference between those two reference voltages—an analog voltage corresponding to δ1, δ2 and δ3 as shown at 363, 365 and 367, respectively. Each differential-step measurement is then concluded through SSADC conversion of the srPGA gain-phase output to a respective digital value (δ1, δ2, δ3).

Figure 12:
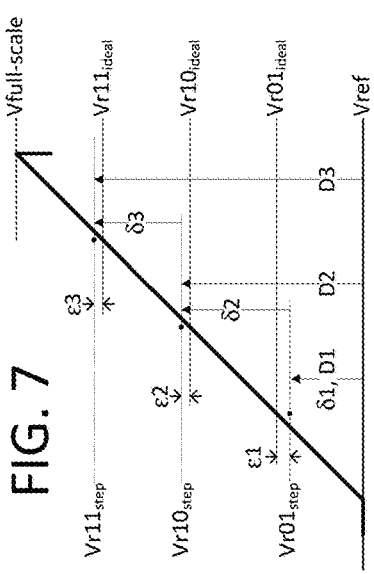
FIG. 12 illustrates an exemplary full-step reference calibration sequence.

FIG. 12 illustrates an exemplary full-step reference calibration sequence—essentially the same as the operations shown and discussed in reference to FIG. 11: deasserting read-select for all pixel rows at 371 to ground the srPGA inputs and measuring D1 at 373 (same value as δ1), but then directly measuring D2 and D3 (at 375 and 377) and storing D1, D2 and D3. The direct measurements of D2 and D3 follow generally the same operational sequence as their differential-step counterparts (δ2, δ3), except that CalibIn is set to select Vref instead of the baseline reference voltage for the subject sub-range, thus producing Vout=Vr10−Vref during the D2 measurement and Vout=Vr11−Vref) during D3 measurement. As the D2 and D3 voltage outputs nominally span two and three sub-ranges, respectively, correspondingly higher-peak SSADC voltage ramps are generated to effect their A/D conversion. Note that in all calibration embodiments, measured values (e.g., D1, D2, D3 or ε1, ε2, ε3) may be store in an on-chip or off-chip calibration data storage.

FIG. 13 illustrates exemplary control signal, voltage ramp and output voltage waveforms corresponding to the δ1 and δ2 measurement operations at 353 and 355 in FIG. 11 (the δ3 measurement is similar, except with CalibIn set to 10 and RstIn set to 11). In both the δ1 and δ2 measurement sequences (401, 403 respectively), MuxRst is asserted during PGA reset (when pga_rst is pulsed) and for a reset sampling interval thereafter to select RstIn (preset at 01b) as the sub-range-select value (srSel[1:0]) and thus, upon deasserting pga_rst, driving a nominal Vref value at the srPGA output (Vout) and precharging alignment capacitor Ca with voltage Vr01−Vref. The comparator clock is pulsed sometime before deasserting MuxRst to strobe CalibIn (preset at 00b to select sub-range baseline value, Vref) into the sub-range flip-flop stage (e.g., flop 217 in FIG. 3—pulsing the comparator clock multiple times to load flops 251, 253, 255 in the FIG. 4 embodiment). Accordingly, when MuxRst goes low at 411, srSel[1:0] transitions from 01b to 00b and the voltage applied to Ca correspondingly transitions from Vr01 to Vref to yield the desired δ1 voltage swing (from Vref to Vr01) at the srPGA output. As shown, one or more Vref samples (each corresponding to a respective small-swing Vramp 415) are captured prior to the srSel switchover (at MuxRst deassertion 411) and one or more stepped-up (to nominal Vr01) samples are captured after srSel switchover (i.e., each effected by a respective sub-range ramp 417). Those samples may be combined (averaged and differenced) by on-chip or off-chip circuitry (including a general- or special-purpose processor) to produce the final δ1 calibration value. The same occurs in the δ2 measurement sequence, but with RstIn set to select Vr10 and CalibIn set to select Vr01 and thus enable SSADC digitization of voltage samples (pre-srSel transition and post-srSel transition) representative of the Vr01 to Vr10 voltage difference.

FIG. 14 illustrates exemplary control signal, voltage ramp and output voltage waveforms corresponding to the D1 and D2 measurement operations at 373 and 375 in FIG. 12 (the D3 measurement is similar, except with RstIn set to 11). The waveforms and operations in the D1 capture are identical to the δ1 capture in FIG. 13 (as those two values are the same). The waveforms and operations in the D2 capture are generally the same as those in the D1 capture, except that RstIn is set to effect a precharge to Vr10 instead of Vr01, thus yielding (at MuxRst transition and srSel switchover from RstIn to CalibIn (00)), an analog voltage step from Vref to Vr10. As before, digital samples captured before and after srSel switchover—with those captured after requiring Vramp through the first two subranges—may be combined (averaged, subtracted from one another) to yield the D2 calibration value. D3 capture is similar to the D2 capture, except with RstIn set to effect precharge (of capacitor Ca) to Vr11 instead of Vr10, and with the post-srSel-transition Vramp extending through the first three subranges (from Vref to a level nominally above Vr11) to capture the post-transition samples.

The various pixel circuit architectures and layouts, imaging circuit architectures, color filter arrays, micro-lens arrays, sub-ranging PGAs (and component circuitry thereof), ADC components, calibration circuitry, control signal generation circuitry (i.e., to support run-time sub-ranging PGA/ADC operation and the various calibration operations discussed above), etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific quantities/types of photodetection elements, photocarrier polarity, pixel array readout architectures, time intervals, transistor types, signal polarities, transistor types (PMOS vs. NMOS), numbers of sub-ranges, relative sizes of sub-ranges (e.g., sub-ranges need not all have nominally uniform voltage spans), bit-depths, encoding schemes, control signal timing patterns, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (sub-range count, bit-depth, calibration value storage, etc.) or any other configurable parameters may be achieved, for example and without limitation, by loading a control value into a register or other storage circuit within above-described integrated circuit devices in response to a host instruction and/or on-board processor or controller (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit component, comprising:
    an amplifier circuit to produce a first output signal in response to an input signal, wherein the amplifier circuit comprises circuitry to produce, in accordance with a voltage level of the input signal, the first output signal to have a voltage within a voltage range that spans a plurality of continuous voltage sub-ranges;
    comparator circuitry to compare the first output signal with one or more reference voltages to identify a first voltage sub-range that encompasses the first output signal, wherein the first voltage sub-range is a single constituent sub-range of the plurality of continuous voltage sub-ranges; and
    voltage-adjust circuitry to selectively adjust a voltage level of the first output signal according to the first voltage-subrange to produce a second output signal.

2. The integrated-circuit component of claim 1, wherein:
    the input signal is generated by a pixel in a pixel array of an image sensor; and
    the amplifier circuit, the comparator circuitry, and the voltage-adjust circuitry are implemented in readout circuitry of the image sensor.

3. The integrated-circuit component of claim 1, wherein the comparator circuitry to compare the first output signal with one or more reference voltages comprises circuitry to compare the first output signal with one or more reference voltages that delineate the continuous voltage-subranges.

4. The integrated-circuit component of claim 1, wherein the plurality of continuous voltage sub-ranges comprises N continuous voltage sub-ranges, N being an integer greater than one.

5. The integrated-circuit component of claim 4, wherein N is greater than three.

6. The integrated-circuit component of claim 1, wherein the voltage-adjust circuitry to selectively adjust the voltage level of the first output signal to produce the second output signal comprises circuitry to subtract a first one of the reference voltages from the first output signal to produce the second output signal, the first one of the reference voltages constituting a boundary of the first voltage sub-range.

7. The integrated-circuit component of claim 6, wherein the amplifier circuit to produce to produce the first output comprises a differential amplifier having (i) a first input capacitively coupled to receive the input signal, (ii) a second input coupled to a predetermined one of the reference voltages, and (iii) an output, capacitively coupled to the first input, to produce the first output signal, and wherein the circuitry to subtract the first one of the reference voltages from the first output signal comprises circuitry to capacitively couple the first one of the reference voltages to the first input of the differential amplifier to shift the first output signal produced at the output of the differential amplifier by a first voltage step nominally corresponding to a difference between the first one of the reference voltages and the predetermined one of the reference voltages coupled to the second input of the differential amplifier.

8. The integrated-circuit component of claim 6, further comprising circuitry to generate a fourth digital value in a calibration operation, the fourth digital value indicating a difference between ideal and actual voltage levels of the first voltage step.

9. The integrated-circuit component of claim 8, further comprising a calibration data storage and circuitry to:
store the fourth digital value in the calibration data storage;
index the calibration data storage based on the second digital value to retrieve the fourth digital value; and
combine the fourth digital value with at least one of the first or third digital values to generate a calibrated digital representation of the input signal.

10. The integrated-circuit component of claim 1, further comprising:
analog-to-digital (A/D) conversion circuitry to convert the second output signal to a first digital value.

11. The integrated-circuit component of claim 10 wherein the A/D conversion circuitry to convert the second output signal to the first digit value comprises single-slope A/D conversion circuitry to:
generate a stepped voltage ramp having a base-to-peak amplitude less than twice the amplitude of the first voltage sub-range;
compare the voltage level of the voltage ramp at successive steps thereof to the second output signal; and
store, as the first digital value, a count value corresponding to a step of the voltage ramp that crosses over a voltage level of the second output signal.

12. The integrated-circuit component of claim 10, further comprising:
circuitry to store a second digital value representative of the first voltage sub-range, the first and second digital values collectively forming a third digital value representative of the input signal.

13. A method of operation within an integrated-circuit component, the method comprising:
amplifying an input signal to produce a first output signal, including producing, in accordance with a voltage level of the input signal, the first output signal to have a voltage within a voltage range that spans a plurality of continuous voltage sub-ranges;
comparing the first output signal with one or more reference voltages to identify a first voltage sub-range that encompasses the first output signal, wherein the first voltage sub-range is a single constituent sub-range of the plurality of continuous voltage sub-ranges; and
selectively adjusting a voltage level of the first output signal according to the first voltage-subrange to produce a second output signal.

14. The method of claim 13, wherein:
the input signal is generated by a pixel in a pixel array of an image sensor; and
the amplifying, the comparing, and the selective adjusting are performed by readout circuitry of the image sensor.

15. The method of claim 13, wherein comparing the first output signal with one or more reference voltages comprises comparing the first output signal with one or more reference voltages that delineate the continuous voltage-subranges.

16. The method of claim 13, wherein selectively adjusting the voltage level of the first output signal to produce the second output signal comprises subtracting a first one of the reference voltages from the first output signal to produce the second output signal, the first one of the reference voltages constituting a boundary of the first voltage sub-range.

17. The method of claim 16, wherein amplifying the input signal to produce the first output comprises capacitively coupling the input signal to a first input of a differential amplifier, the differential amplifier having an output, capacitively coupled to the first input, to produce the first output signal, and wherein subtracting the first one of the reference voltages from the first output signal comprises capacitively coupling the first one of the reference voltages to the first input of the differential amplifier to shift the first output signal produced at the output of the differential amplifier by a first voltage step nominally corresponding to a difference between the first one of the reference voltages and a predetermined one of the reference voltages coupled to a second input of the differential amplifier.

18. The method of claim 16, further comprising generating a fourth digital value in a calibration operation, the fourth digital value indicating a difference between ideal and actual voltage levels of the first voltage step.

19. The method of claim 13, further comprising:
executing an analog-to-digital (A/D) conversion of the second output signal to produce a first digital value.

20. The method of claim 19, further comprising:
storing a second digital value representative of the first voltage sub-range, the first and second digital values collectively forming a third digital value representative of the input signal.

* * * * *